United States Patent [19]
Hashimoto

[11] Patent Number: 5,773,354
[45] Date of Patent: Jun. 30, 1998

[54] METHOD OF FORMING SOI SUBSTRATE

[75] Inventor: Makoto Hashimoto, Kanagawa, Japan

[73] Assignee: Sony Corporation, Tokyo, Japan

[21] Appl. No.: 831,414

[22] Filed: Apr. 1, 1997

[30]     Foreign Application Priority Data

Apr. 1, 1996   [JP]   Japan ..................................... 8-078483

[51] Int. Cl.$^6$ ................................................... H04L 21/30
[52] U.S. Cl. ......................... 438/459; 438/404; 438/406; 438/977; 438/928
[58] Field of Search .................................... 438/459, 404, 438/405, 406, 977, 928

[56]             References Cited

U.S. PATENT DOCUMENTS

| | | | |
|---|---|---|---|
| 5,437,762 | 8/1995 | Ochiai et al. | ............................ 438/459 |
| 5,474,952 | 12/1995 | Fujii | ........................................ 438/406 |
| 5,597,739 | 1/1997 | Sumi et al. | .............................. 438/406 |

*Primary Examiner*—Trung Dang
*Attorney, Agent, or Firm*—Hill & Simpson

[57]            ABSTRACT

The present invention provides a method of forming an SOI substrate which causes no variation in thickness of SOI layers formed by polishing the silicon substrate, thereby causing no factor interfering with a reduction in thickness of the SOI layers.

In the method of forming an SOI substrate, the surface of a silicon substrate which is form to have unevenness is covered with an insulator serving as a polishing stopper layer, and a polishing substrate is laminated on the insulator. The rear side of the silicon substrate is chemically polished with a polishing solution consisting of an alkali solution to leave as SOI layers the projection portions of the silicon substrate. At this time, the polishing pressure and the rotation speed of a polishing tool are set so that the differential coefficient of the rate of reduction in thickness of the silicon substrate with respect to the product of the polishing pressure and the rotation speed of the polishing tool is substantially equal to the differential coefficient of the rate of reduction in thickness of the SOI layers with respect to that product. It is thus possible to suppress the reduction in thickness of the SOI layers and maintain the thickness precision of the SOI layers in chemical polishing.

2 Claims, 5 Drawing Sheets

METHOD OF FORMING SOI SUBSTRATE

BACKGROUND OF THE INVENTION

1. Field of the Invention

The present invention relates to a method of forming an SOI substrate by laminating in a manufacturing process for a semiconductor device.

2. Description of the Related Art

A transistor formed on single crystal silicon (Silicon on Insulator: SOI) on an insulator such as an oxide film has excellent radiation resistance and latch up properties, and the excellent effect of suppressing a short channel effect. Particularly, since the method of forming an SOI substrate by a wafer laminating technique is capable of obtaining an SOI layer having less defects, the transistor formed on the SOI layer has excellent characteristics. In recent years, this method of forming an SOI substrate has become the most attractive technique in the manufacture of a semiconductor device.

As the method of forming an SOI substrate by using the laminating technique, a selective polishing method is known which uses a polishing stopper layer.

This method comprises oxidizing the uneven surface 11a of a silicon substrate 11 to form a polishing stopper layer 12 comprising an oxide film on the surface 11a of the silicon substrate 11, as shown in FIG. 4A. Then, a rear-side gate 13 comprising polysilicon is formed on the polishing stopper layer 12, and an oxide film 14 and a flattened polysilicon layer 15 are formed to cover the rear-side gate 13, as shown in FIG. 4B. A second silicon substrate serving as a polishing substrate 16 is then laminated on the flattened polysilicon layer 15 to form a laminated substrate 17.

Thereafter, the rear side of the silicon substrate 11 is polished. In this case, the rear side of the silicon substrate 11 is first polished until the thickness $T_1$ of the silicon substrate 11 on the polishing stopper layer 12 becomes 3 to 10 μm, as shown in FIG. 5A. After polishing damage is removed by, for example, chemical mechanical polishing, the silicon substrate 11 is then polished by chemical polishing using a polishing solution comprising an alkali solution such as an aqueous ethylenediamine solution until the projection faces 12 (faces on the silicon substrate side near the rear side thereof) of the polishing stopper layer 12 are exposed over the entire polished surface, as shown in FIG. 5B. As a result, the projection portions of the silicon substrate 11 are left as SOI layers 10a and 10b between the respectively projection surfaces 12a of the polishing stopper layer 12. The chemical polishing proceeds by wiping off the products of reaction of the polishing solution and silicon with a polishing cloth. Therefore, in the chemical polishing, the rate of reduction in thickness of the SOI layers 10a and 10b formed between the exposed projection faces 12a in a region where the polishing stopper layer 12 is exposed is significantly decreased, and polishing of the silicon substrate 11 in a region where the polishing stopper layer 12 is not exposed selectively proceeds.

However, in the above method of forming the SOI substrate, in chemical polishing of the silicon substrate, the rate of reduction in thickness in a region where the polishing stopper layer is exposed is significantly decreased earlier than in the other regions, but etching of the SOI layers with the polishing solution proceeds. Therefore, the thickness of the SOI layer 10a is earlier decreased due to etching in the region where the polishing stopper layer 12 is exposed than in the other regions to the time the projection surfaces 12a of the polishing stopper layer 12 are exposed over the entire region of the polishing surface at the end of polishing.

Recently, a semiconductor device has progressively been formed in a fine structure with improvements in integration and function of the semiconductor device. Accordingly, when a transistor is formed on the SOI layer, development is progressed in consideration of a device having a gate length of 0.1 μm. As a result, the thickness required for the SOI layer is decreased to about 30±4 nm, and the margin for variation in the thickness is also decreased. Thus the above chemical polishing method is difficult to form an SOI substrate having thin SOI layers having less variations in the thickness, and causes a factor which interferes with formation of a fine device structure.

SUMMARY OF THE INVENTION

Accordingly, an object of the present invention is to provide a method of forming an SOi substrate which is capable of solving the above problem.

In order to achieve the object of the present invention, there is provided a method of forming an SOI substrate comprising coating, with an insulator, the surface of a silicon substrate which is formed to have unevenness, and polishing the rear side of the silicon substrate by chemical polishing using a polishing solution comprising an alkali solution to leave the projection portions of the silicon substrate as SOI layers, wherein chemical polishing is carried out at a polishing pressure and a rotation speed of a polishing tool which are set so that the product of the polishing pressure and the rotation speed of the polishing tool is ±50% of the optimum value of the product at which the differential coefficient of the rate of reduction in thickness of the silicon substrate with respect to the product of the polishing pressure and the rotation speed is equal to the differential coefficient of the rate of reduction in thickness of the SOI layers with respect to the product of the polishing pressure and the rotation speed. In this method, the insulator is used as a polishing stopper, and chemical polishing is started immediately before the polishing stopper is exposed and performed until the polishing stopper is exposed.

As shown in FIG. 1A, when the rotation speed rot of the polishing tool is kept constant, the rate of reduction in thickness of the silicon substrate (graph F1) due to chemical polishing increases in proportion to the polishing pressure W, while the rate of reduction in thickness of the SOI layer (graph F2) less depends upon the polishing pressure W. On the other hand, as shown in FIG. 1B, when the polishing pressure W is kept constant, the rate of reduction in thickness of the silicon substrate (graph F3) becomes constant when the rotation speed rot of the polishing tool is increased to the predetermined value, while the rate of reduction in thickness of the SOI layer (graph F4) increases in proportional to the rotation speed rot of the polishing tool. Therefore, when chemical polishing is performed under conditions in which the differential coefficient of the rate of reduction in thickness of the silicon substrate with respect to the product of the polishing pressure W and the rotation speed rot of the polishing tool is substantially equal to the differential coefficient of the rate of reduction in thickness of the SOI layer with respect to the product of the polishing pressure W and the rotation speed rot of the polishing tool, as in the above method of forming the SOI substrate, the rate of reduction in thickness of the silicon substrate is higher than the rate of reduction in thickness of the SOI layer. Therefore, as chemical polishing proceeds, the reduction in thickness of the SOI layers remaining in the region where the polishing stopper is exposed is suppressed, while chemical polishing of the silicon substrate portion above the polishing stopper layer proceeds.

DESCRIPTION OF THE EMBODIMENT OF THE INVENTION

A method of forming an SOI substrate in accordance with an embodiment of the present invention will be described below with reference to the drawings.

Figure 4A:
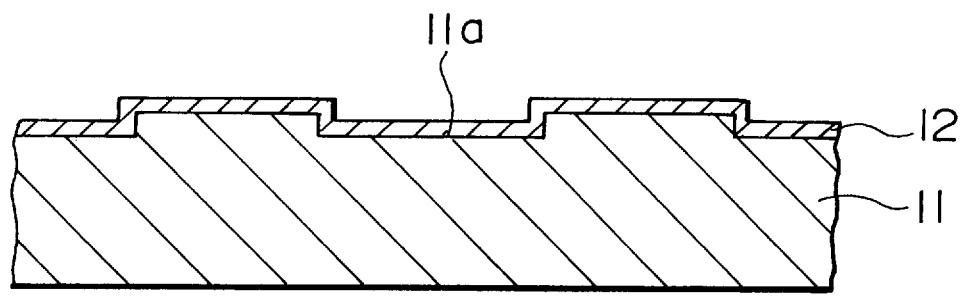
FIG. 4 is a sectional view illustrating a process for forming a laminated substrate.
Figure 4B:
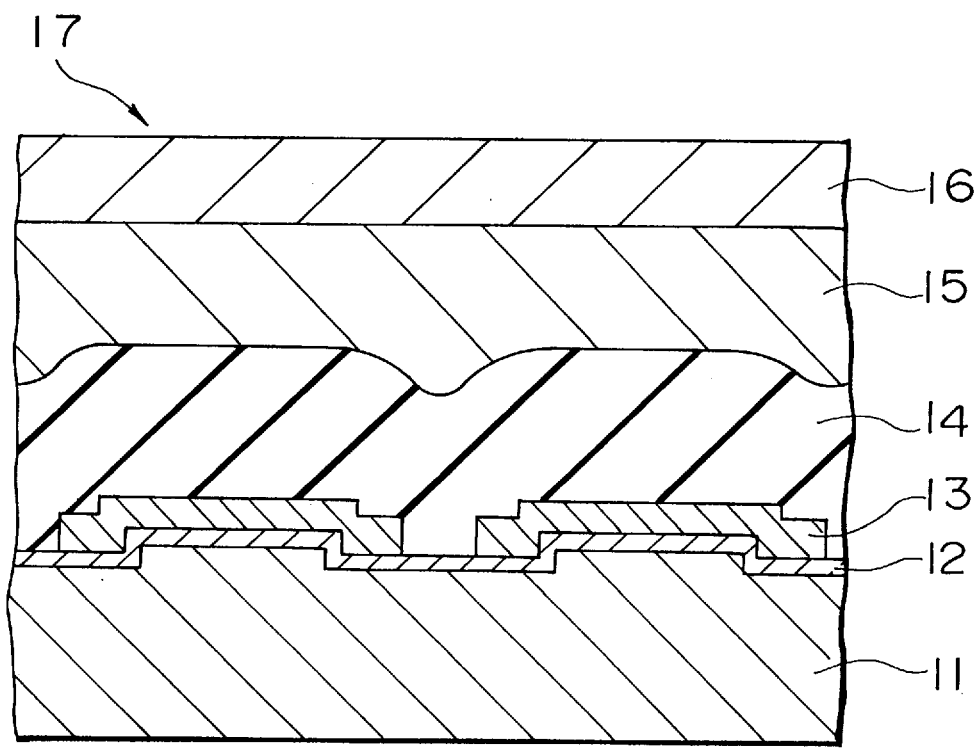
Figure 5A:
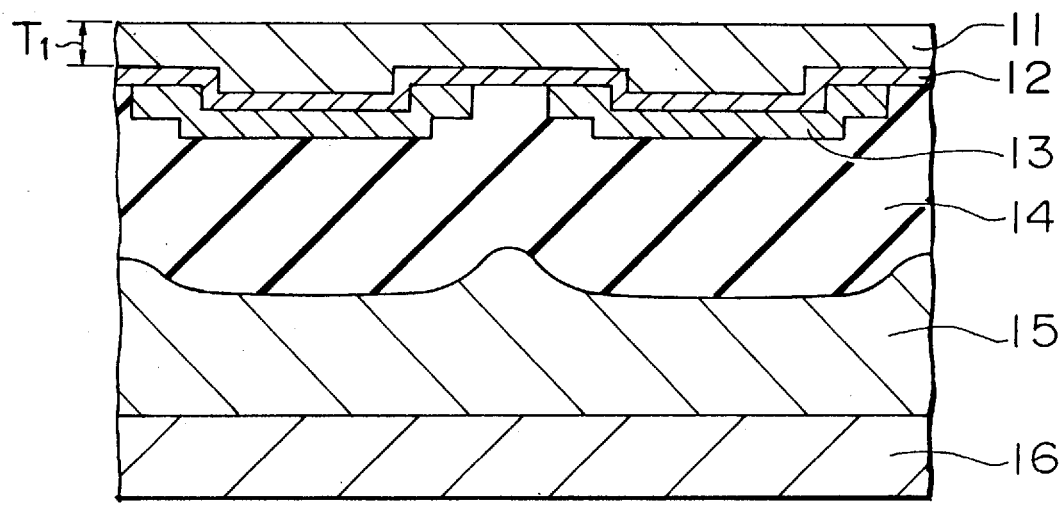
FIG. 5 is a sectional view illustrating a conventional process.
Figure 5B:
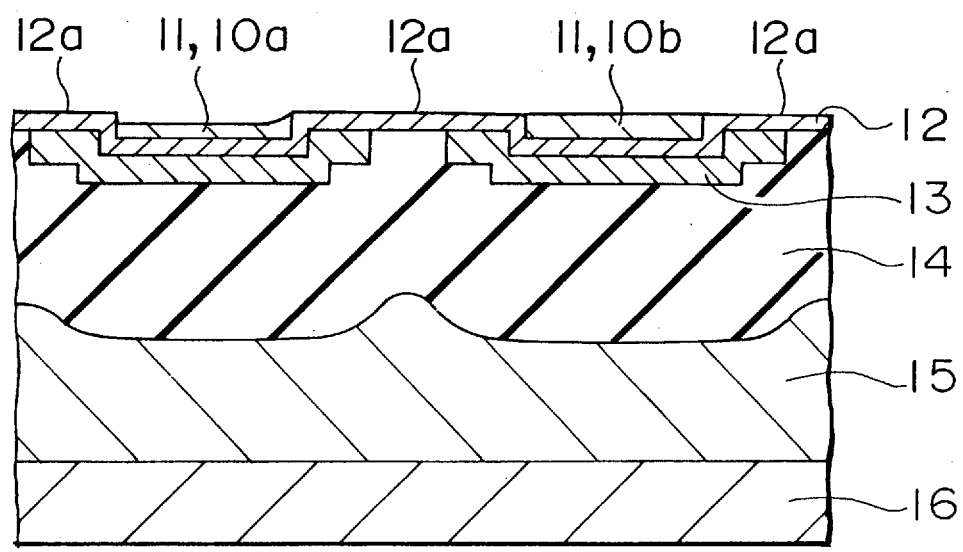

A laminated substrate 17 comprising a silicon substrate 11, a polishing stopper layer 12 formed to have unevenness and cover the silicon substrate 11, a rear-side gate 13, an oxide film 14, a flattened polysilicon film 15, and a polishing substrate 16 laminated on the silicon substrate 11 with these films therebetween is formed by the same method as described above with reference to FIGS. 4A and 4B. However, the polishing stopper layer 12 comprises an insulating material having etching resistance to the polishing solution used for chemical polishing which is subsequently performed.

Figure 3A:
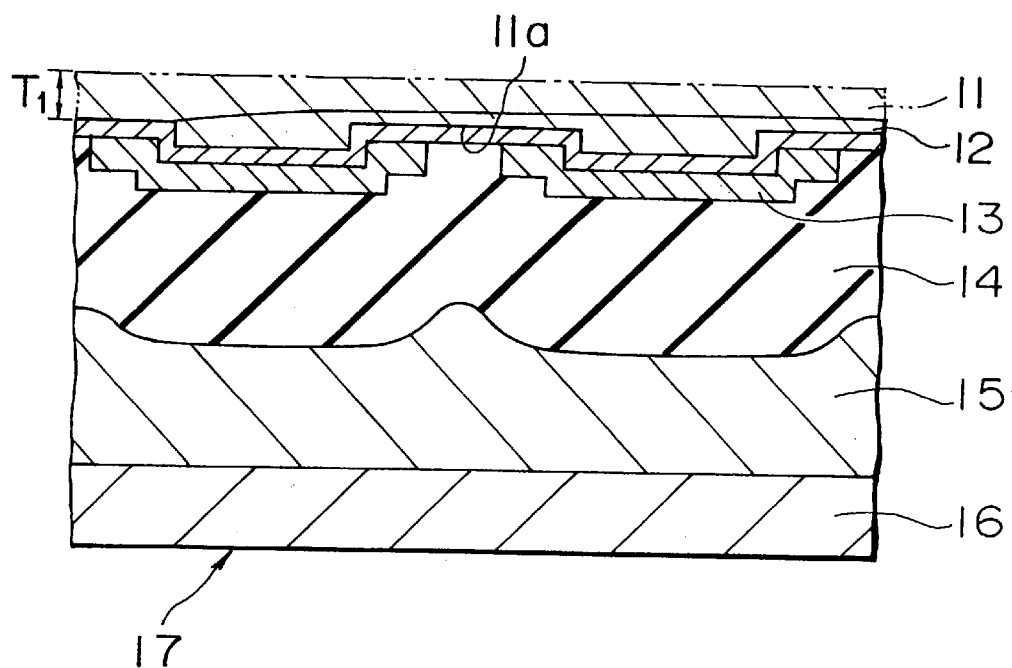
FIG. 3 is a sectional view illustrating a process in accordance with an embodiment of the present invention.

As shown in FIG. 3A, the rear side of the silicon substrate 11 is ground to reduce the thickness $T_1$ of the silicon substrate 11 to about 3 to 10 μm. In order to remove grinding damage, the rear side of the silicon substrate 11 is then chemically mechanically polished with a polishing solution containing abrasive grains, e.g., colloidal silica, and an alkali solution such as an aqueous ammonia solution.

The chemical mechanical polishing with the polishing solution is performed at a polishing pressure and a rotation speed of a polishing tool which are set to, for example, 140 to 150 g/cm$^2$ and 30 r/min, respectively.

Although the above process is performed in the same manner as, for example, a conventional technique, the chemical mechanical polishing is carried out immediately before the polishing stopper layer 12 is exposed in order to ensure the polishing rate and improve throughput.

Figure 2:
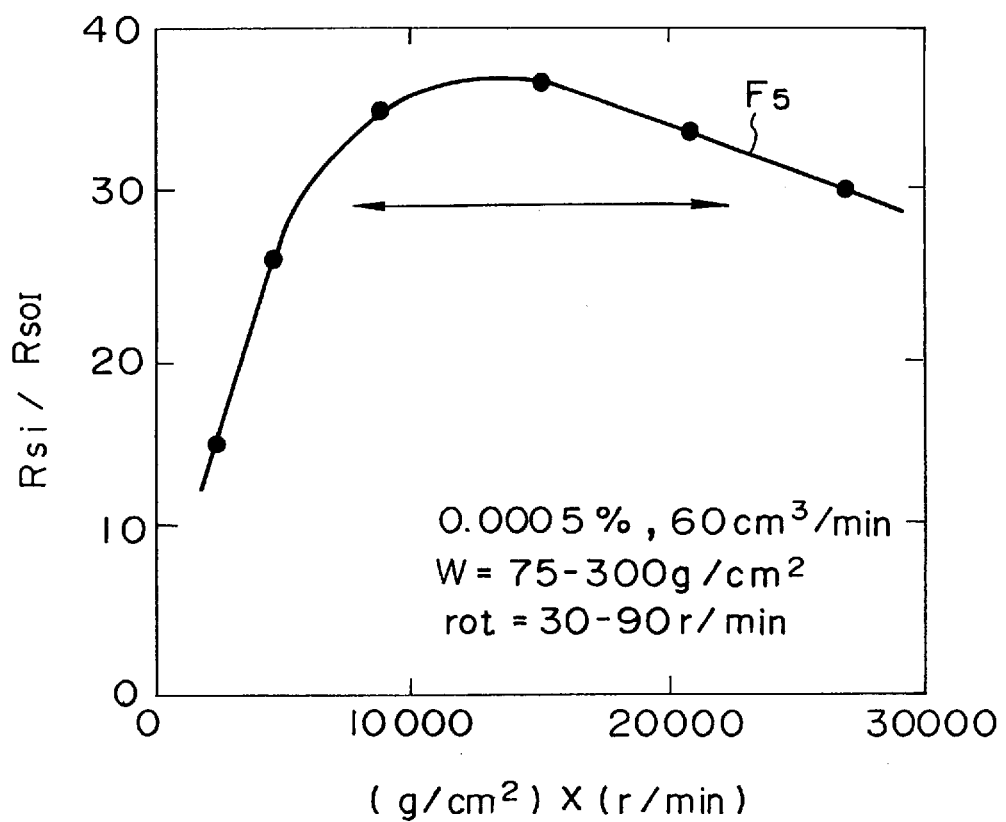
FIG. 2 is a graph showing the ratio of the rate of reduction in thickness of a silicon substrate to the rate of reduction in thickness of an SOI layer against the product of the rotation speed of a polishing tool and the polishing pressure.
Figure 3B:
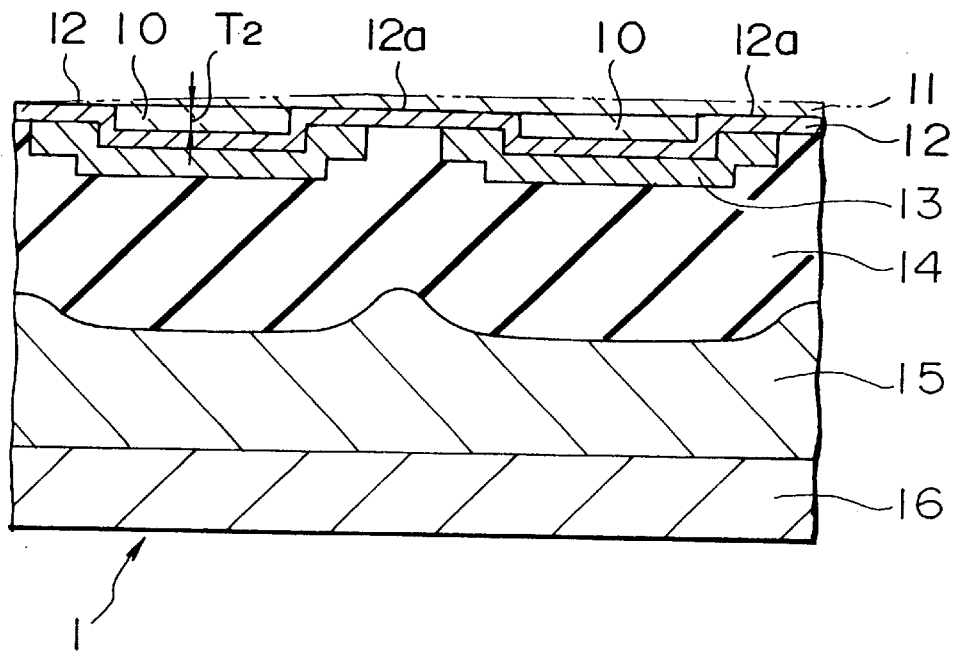

Then, the silicon substrate 11 is chemically polished with a polishing solution comprising an alkali solution such as an aqueous ethylenediamine solution or an aqueous ammonia solution, as shown in FIG. 3B. A point of the method of forming the SOI substrate lies in setting of the polishing pressure and the rotation speed of the polishing tool in the chemical polishing. The polishing pressure represents the pressure applied to the polishing surface, and the rotation speed of the polishing tool represents the rotation speed of the polishing tool disposed opposite to a holding tool for supporting the laminated substrate 17. The procedure for setting the polishing pressure and the rotation speed of the polishing tool in the chemical polishing will be described below with reference to FIGS. 1A and 1B and FIG. 2.

An example wherein polishing is carried out using a 0.0005% ethylenediamine solution as the polishing solution at a flow rate of the polishing solution set to 60 cm$^3$/min in an atmosphere of room temperature of 20° C. is described. In this example, the rotation speed of the holding tool is equal to the rotation speed of the polishing tool.

Figure 1A:
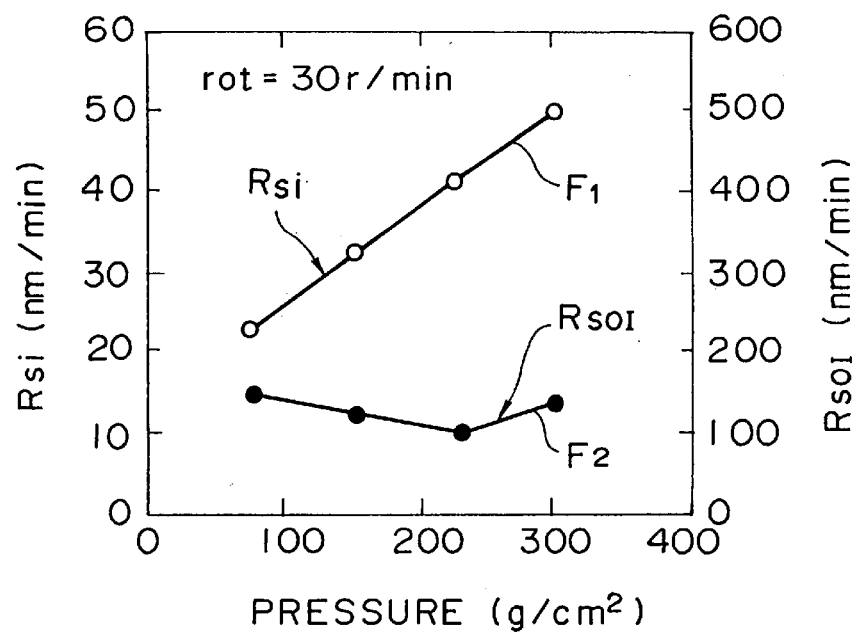
FIG. 1 is a graph showing the rates of reduction in thickness of a silicon substrate and a SOI layer.

As shown in FIG. 1A, graph F1 is first determined in which the polishing pressure W is shown on the abscissa, and the rate $R_{Si}$ of reduction in thickness of the silicon substrate is shown on the ordinate and which shows the dependency of the rate $R_{Si}$ of reduction in thickness of the silicon substrate on the polishing pressure W at the rotation speed rot of the polishing tool kept constant in chemical polishing. This graph F1 shows as an example a case wherein the rotation speed rot of the polishing tool is rot=30 r/min. This graph F1 indicates that at the rotation speed of the polishing tool kept constant, the rate $R_{Si}$ of reduction in thickness of the silicon substrate increases in proportion to the polishing pressure W. The rate Rsi of reduction in thickness of the silicon substrate means the rate $R_{Si}$ of reduction in thickness of the silicon substrate in chemical polishing when the entire polished surface comprises the silicon substrate.

Similarly, graph F2 is determined which shows the dependency of the rate $R_{SOI}$ of reduction in thickness of the SOI layer on the polishing pressure W, i.e., the rate of reduction in thickness of the projection portions of the silicon substrate 11 remaining between the polishing stopper layers 12 when polishing reaches to the polishing stopper layer 12, as shown in FIG. 3B, at the rotation speed rot of the polishing tool kept constant in the chemical polishing. Graph F2 indicates that the rate $R_{SOI}$ of reduction in thickness of the SOI layer has low dependency on the polishing pressure W.

Figure 1B:
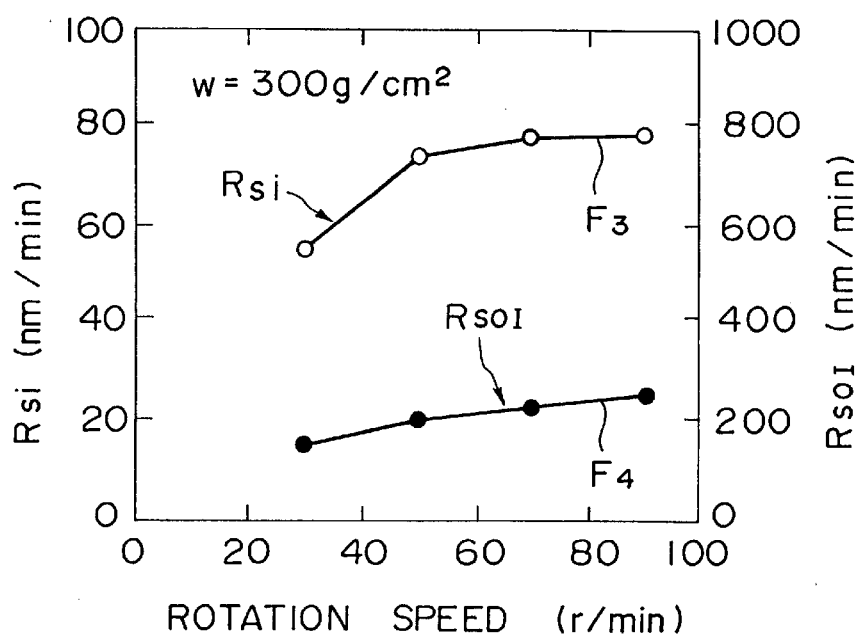

Furthermore, graph F3 is determined in which the rotation speed rot of the polishing tool is shown on the abscissa, and the rate $R_{Si}$ of reduction in thickness of the silicon substrate in chemical polishing is shown on the ordinate, and which shows the dependency of the rate $R_{Si}$ of reduction in thickness of the silicon substrate on the rotation speed rot of the polishing tool when the polishing pressure W is constant in chemical polishing, for example, as shown in FIG. 1B. Graph F3 shows the case where the polishing pressure is 300 g/cm2. Graph F3 indicates that the rate $R_{Si}$ of reduction in thickness of the silicon substrate increases in proportion to the rotation speed rot of the polishing tool, and becomes a constant value when the rotation speed rot is increased to a predetermined value.

Similarly, graph F4 is determined which shows the dependency of the rate $R_{SOI}$ of reduction in thickness of the SOI layer on the rotation speed rot of the polishing tool when the polishing pressure W is constant in the chemical polishing. Graph F4 indicates that the rate $R_{SOI}$ of reduction in thickness increases in proportion to the rotation speed rot of the polishing tool.

Next, on the basis of the results of graphs F1 to F4, graph 5 is determined in which the product of the polishing pressure W and the rotation speed rot of the polishing tool is shown on the abscissa, and the ratio of the rate $R_{Si}$ of reduction in thickness of the silicon substrate to the rate $R_{SOI}$ of reduction in thickness of the SOI layer is shown on the ordinate. In this figure, when the differential coefficient of the rate $R_{Si}$ of reduction in thickness of the silicon substrate is substantially equal to the differential coefficient of the rate $R_{SOI}$ of reduction in thickness of the SOI layer with respect to the product of the polishing pressure W and the rotation speed rot of the polishing tool, the product is considered as the optimum value. Therefore, in graph 5, the optimum value is near the product W×rot of 13000 which is the maximum value.

Accordingly, as an example of polishing conditions which show a product value near the maximum value, a polishing pressure W of 300 g/cm$^2$ and a rotation speed rot of the polishing tool of 50 r/min are selected, and chemical polishing is carried out, as shown in FIG. 3B. In chemical polishing, a 0.0005% ethylenediamine solution is used as the polishing solution, the flow rate of the polishing solution is set to 60 cm$^3$/min and an atmosphere is maintained at room temperature of 20° C. In this polishing, the silicon substrate 11 is polished to a state where the projection surfaces 12a of the polishing stopper layer 12 are exposed over the entire polishing surface, leaving as the SOI layers 10 the projection portions of the silicon substrate 11 only between the projection surfaces 12a.

The polishing pressure W and the rotation speed rot of the polishing tool are set so that the product of the polishing pressure W and the rotation speed of the polishing tool is within the range of ±50% (the range shown by arrows in FIG. 2) of the maximum product of 13000 in graph F5 shown in FIG. 2. This can maintain a stable ratio (in this figure, 33 or more) of the rate $R_{Si}$ of reduction in thickness of the silicon substrate to the rate $R_{SOI}$ of reduction in thickness of the SOI layer in chemical polishing. Since the rotation speed rot of the polishing tool and the polishing pressure W depend upon the type, the concentration and flow rate of the polishing solution used, and the temperature of the polishing atmosphere, the optimum values of the rotation speed rot of the polishing tool and the polishing pressure W are determined as described above each time the type, concentration and flow rate of the polishing solution used, and the temperature of the polishing atmosphere are changed in chemical polishing.

The SOI substrate 1 having the SOI layers 10 comprising the projection portions of the silicon substrate 11 is formed as described above.

The chemical polishing is performed by a polishing device different from that used in the chemical mechanical polishing process described above with reference to FIG. 3A. This prevents a different type of polishing solution remaining in a supply system for the polishing solution and a polishing pad from affecting chemical polishing with the polishing solution comprising an alkali solution. However, polishing in the first step of the chemical polishing described above with reference to FIG. 3A is not limited to the chemical mechanical polishing, any polishing method may be employed as long as the polishing rate of the silicon substrate is maintained at the predetermined value or more.

The polishing solution used in the chemical polishing contains no abrasive grain.

In the above method of forming the SOI substrate, chemical polishing of the silicon substrate is carried out in a combination of the polishing pressure W and the rotation speed rot of the polishing tool which are set so that the ratio of the rate RSi of reduction in thickness of the silicon substrate to the rate $R_{SOI}$ of reduction in thickness of the SOI layer 10 (the rate of reduction in thickness of the projection portions of the silicon substrate 11) becomes maximum. Thus, as chemical polishing proceeds, the reduction in thickness of the SOI layers 10 remaining in the region where the polishing stopper layer 12 is exposed is suppressed, while portions of the silicon substrate 11 above the polishing stopper layer 12 are polished.

As a result, the thickness $T_2$ of the SOI layer 10 formed in each region becomes a value closer to the difference in height of the original unevenness formed in the silicon substrate 11, thereby suppressing variations in the SOI layers 10 to a low level.

As described above, the method of forming the SOI substrate of the present invention comprises chemically polishing the rear side of a silicon substrate to the state where only projection portions of the silicon substrate having an uneven surface are left as the SOI layers, wherein chemical polishing is performed at the polishing pressure and the rotation speed of the polishing tool which are set so that the differential coefficient of the rate of reduction in thickness of the silicon substrate with respect to the product of the polishing pressure and the rotation speed of the polishing tool is equal to the differential coefficient of the rate of reduction in thickness of the SOIL layers with respect to the product of the polishing pressure and the rotation speed of the polishing tool. It is thus possible to selectively progress polishing of portions of the silicon substrate above the polishing stopper layer while suppressing the reduction in thickness of the projection portions of the silicon substrate, i.e., the SOI layers, remaining in the region where the polishing stopper layer is exposed as chemical polishing proceeds. As a result, in formation of the SOI substrate, the thicknesses of the SOI layers in the wafer face can be made uniform, and a semiconductor device formed on the SOI substrate can be formed in a fine structure.

What is claimed is:

1. A method of forming an SOI substrate comprising the steps of:

covering the surface of a silicon substrate which is formed to have unevenness with an insulator;

laminating another substrate to the silicon substrate; and chemically polishing the laminated substrates from the rear side of the silicon substrate with a polishing solution comprising an alkali solution using the insulator as a polishing stopper layer, to leave as an SOI layer the projection portion of the first silicon substrate;

wherein the product of the polishing pressure and the rotation speed of a polishing tool in the chemical polishing is set to a value within ±50% of the optimum value at which the differential coefficient of the rate of reduction in thickness of the silicon substrate with respect to the produce of the polishing pressure and the rotation speed is equal to that of the rate of reduction in thickness of the SOI layer with respect to the product of the polishing pressure and the rotation speed.

2. A method of forming an SOI substrate according to claim 1, wherein the chemical polishing of the silicon substrate is started immediately before the polishing stopper layer is exposed and finished when the polishing stopper layer is exposed over the entire polished surface.

* * * * *